(12) United States Patent
Chang et al.

(10) Patent No.: US 11,688,802 B2
(45) Date of Patent: Jun. 27, 2023

(54) HIGH ELECTRON MOBILITY TRANSISTOR AND FABRICATION METHOD THEREOF

(71) Applicant: UNITED MICROELECTRONICS CORP., Hsin-Chu (TW)

(72) Inventors: Chih-Wei Chang, Tainan (TW); Yao-Hsien Chung, Kaohsiung (TW); Shih-Wei Su, Tainan (TW); Hao-Hsuan Chang, Kaohsiung (TW); Ting-An Chien, Tainan (TW); Bin-Siang Tsai, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 284 days.

(21) Appl. No.: 17/179,322

(22) Filed: Feb. 18, 2021

(65) Prior Publication Data
US 2022/0262939 A1   Aug. 18, 2022

(51) Int. Cl.
*H01L 29/778* (2006.01)
*H01L 29/66* (2006.01)
*H01L 29/20* (2006.01)

(52) U.S. Cl.
CPC ...... *H01L 29/7786* (2013.01); *H01L 29/2003* (2013.01); *H01L 29/66462* (2013.01)

(58) Field of Classification Search
CPC ............... H01L 29/7786; H01L 29/778; H01L 29/2003; H01L 29/66462; H01L 29/66; H01L 29/66007; H01L 29/66045; H01L 29/00; H01L 29/02; H01L 29/1037
USPC ............................................................ 257/76
See application file for complete search history.

(56) References Cited

U.S. PATENT DOCUMENTS

| | | | |
|---|---|---|---|
| 7,985,986 B2 | 7/2011 | Heikman | |
| 9,755,040 B2 | 9/2017 | Aoki | |
| 9,818,840 B2* | 11/2017 | Kikkawa | H01L 29/2003 |
| 10,068,976 B2 | 9/2018 | Yeh | |
| 10,680,094 B2 | 6/2020 | Banerjee | |
| 2010/0102357 A1 | 4/2010 | Sato | |
| 2011/0227093 A1 | 9/2011 | Hikita | |
| 2012/0091522 A1 | 4/2012 | Ozaki | |
| 2012/0205662 A1* | 8/2012 | Nakamura | H01L 29/7787 257/E21.409 |
| 2018/0350945 A1* | 12/2018 | Hsu | H01L 29/41766 |
| 2019/0280095 A1* | 9/2019 | Chen | H10B 12/053 |
| 2020/0328298 A1 | 10/2020 | Yang | |

* cited by examiner

*Primary Examiner* — Tucker J Wright
*Assistant Examiner* — Azm A Parvez
(74) *Attorney, Agent, or Firm* — Winston Hsu

(57) ABSTRACT

A method for forming a high electron mobility transistor is disclosed. A substrate is provided. A channel layer is formed on the substrate. An electron supply layer is formed on the channel layer. A dielectric passivation layer is formed on the electron supply layer. A gate recess is formed into the dielectric passivation layer and the electron supply layer. A surface modification layer is conformally deposited on an interior surface of the gate recess. The surface modification layer is then subjected to an oxidation treatment or a nitridation treatment. A P-type GaN layer is formed in the gate recess and on the surface modification layer.

13 Claims, 3 Drawing Sheets

HIGH ELECTRON MOBILITY TRANSISTOR AND FABRICATION METHOD THEREOF

BACKGROUND OF THE INVENTION

1. Field of the Invention

The present invention relates to the field of compound semiconductor technology, and more particularly to a gallium nitride (GaN) high electron mobility transistor (HEMT) and a method of fabricating the same.

2. Description of the Prior Art

Gallium nitride high electron mobility transistors (GaN HEMT) are often used in high frequency, high power amplifier components with high breakdown voltage, high electron mobility and saturated carrier velocity, and high temperature operation.

According to the prior art, forming a normally-off GaN HEMT generally requires directly etching a P-type GaN layer, or using a re-growth method to grow an AlGaN layer on a P-type GaN layer. However, in the above method, directly etching the P-type GaN layer causes etching damage of the underlying AlGaN layer, and the re-growth process step is too complex, the productivity is low, and the cost is too high. Further, when forming the recessed gate of the normally-off GaN HEMT, the surface roughness at the interface between the AlGaN layer and the P-type GaN layer may adversely affect the device performance.

SUMMARY OF THE INVENTION

The present disclosure provides an improved gallium nitride high electron mobility transistor and a method of fabricating the same that can solve the deficiencies and shortcomings of the prior art as described above.

One aspect of the invention provides a method for forming a high electron mobility transistor. A substrate is provided. A channel layer is formed on the substrate. An electron supply layer is formed on the channel layer. A dielectric passivation layer is formed on the electron supply layer. A gate recess is formed into the dielectric passivation layer and the electron supply layer. A surface modification layer is conformally deposited on an interior surface of the gate recess. The surface modification layer is then subjected to an oxidation treatment or a nitridation treatment. A P-type GaN layer is formed in the gate recess and on the surface modification layer.

According to some embodiments, the surface modification layer is an amorphous silicon layer.

According to some embodiments, the amorphous silicon layer has a thickness of equal to or less than 10 angstroms.

According to some embodiments, after subjecting the surface modification layer to the oxidation treatment or the nitridation treatment, an entire thickness of the amorphous silicon layer is transformed into a silicon oxide layer or a silicon nitride layer.

According to some embodiments, the gate recess does not penetrate through the electron supply layer.

According to some embodiments, the dielectric passivation layer comprises oxide or aluminum nitride.

According to some embodiments, the dielectric passivation layer is thicker than the surface modification layer.

According to some embodiments, the dielectric passivation layer has a thickness of about 20 nanometers.

According to some embodiments, before forming the channel layer on the substrate, a buffer layer is formed on the substrate.

According to some embodiments, the buffer layer comprises AlN or AlGaN.

According to some embodiments, the substrate is a silicon substrate.

According to some embodiments, the channel layer comprises intrinsic GaN.

According to some embodiments, the electron supply layer comprises AlGaN.

According to some embodiments, after forming the P-type GaN layer in the gate recess, a gate electrode is formed on the P-type GaN layer. A source electrode is formed in a source region and a drain electrode is formed in a drain region.

According to some embodiments, the surface modification layer is first subjected to the oxidation treatment and is then subjected to the nitridation treatment.

According to some embodiments, the surface modification layer is first subjected to the nitride treatment and is then subjected to the oxidation treatment.

Another aspect of the invention provides a high electron mobility transistor including a substrate; a channel layer on the substrate; an electron supply layer on the channel layer; a dielectric passivation layer on the electron supply layer; a gate recess in the dielectric passivation layer and the electron supply layer; a surface modification layer on an interior surface of the gate recess; and a P-type GaN layer in the gate recess and on the surface modification layer. The surface modification layer has a gradient silicon concentration.

According to some embodiments, the surface modification layer is a silicon oxide layer or a silicon nitride layer.

According to some embodiments, the gate recess does not penetrate through the electron supply layer.

According to some embodiments, the high electron mobility transistor further includes a gate electrode on the P-type GaN layer, a source electrode in a source region, and a drain electrode in a drain region.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
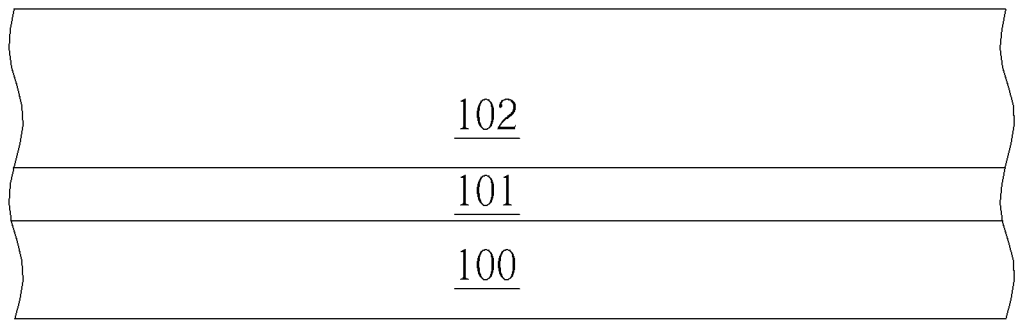
FIG. 1 to FIG. 6 are schematic cross-sectional views showing the fabrication of a high electron mobility transistor according to an embodiment of the invention.

FIG. 1 to FIG. 6 are schematic cross-sectional views showing the fabrication of a high electron mobility transistor according to an embodiment of the invention. As shown in FIG. 1, a substrate 100 is provided. For example, the substrate 100 may be a silicon substrate, but is not limited thereto. A channel layer 102 may be grown on the substrate 100. According to an embodiment, for example, the channel layer 102 may comprise intrinsic GaN. Optionally, before the formation of the channel layer 102, a buffer layer 101 may be formed on the substrate 100. For example, the buffer layer 101 may comprise AlN or AlGaN, but is not limited thereto.

Figure 2:
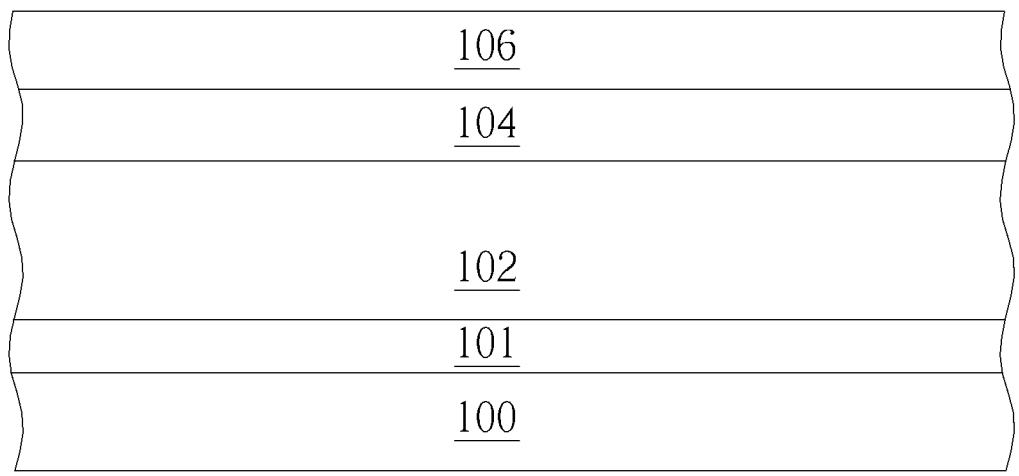

As shown in FIG. 2, an electron supply layer 104 is then formed on the channel layer 102. According to an embodiment, for example, the electron supply layer 104 may comprise AlGaN, but is not limited thereto. Subsequently, a dielectric passivation layer 106 is formed on the electron supply layer 104. According to an embodiment, for example, the dielectric passivation layer 106 may comprise oxide or aluminum nitride, but is not limited thereto. According to an embodiment, for example, the dielectric passivation layer 106 may have a thickness of about 20 nanometers.

Figure 3:
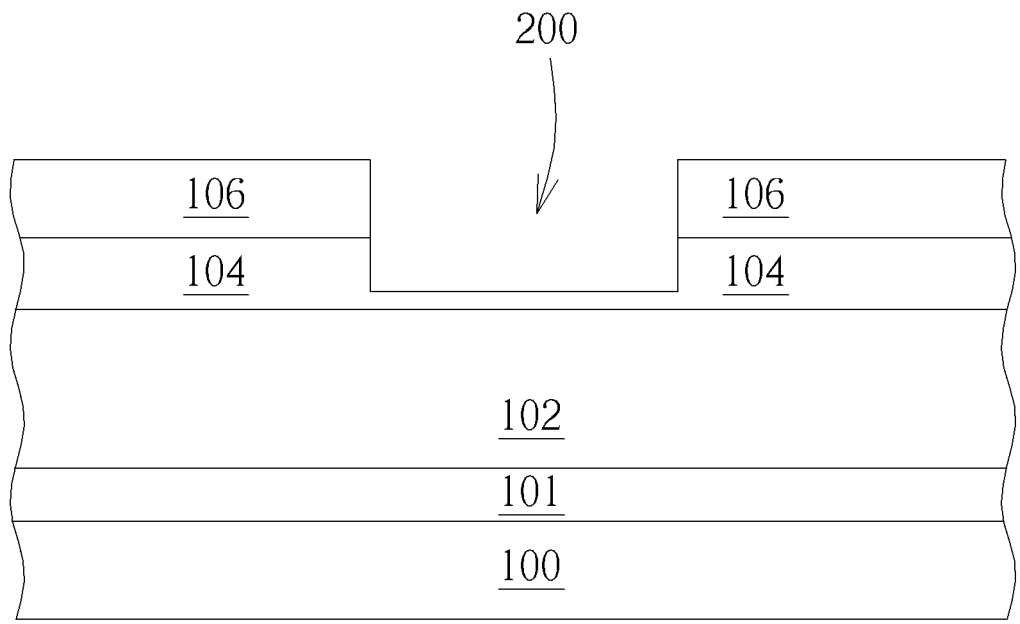

As shown in FIG. 3, after forming the dielectric passivation layer 106, a lithographic process and an etching process are performed to form a gate recess 200 into the dielectric passivation layer 106 and the electron supply layer 104. According to an embodiment, the gate recess 200 penetrates through the dielectric passivation layer 106, but does not penetrate through the electron supply layer 104.

Figure 4:
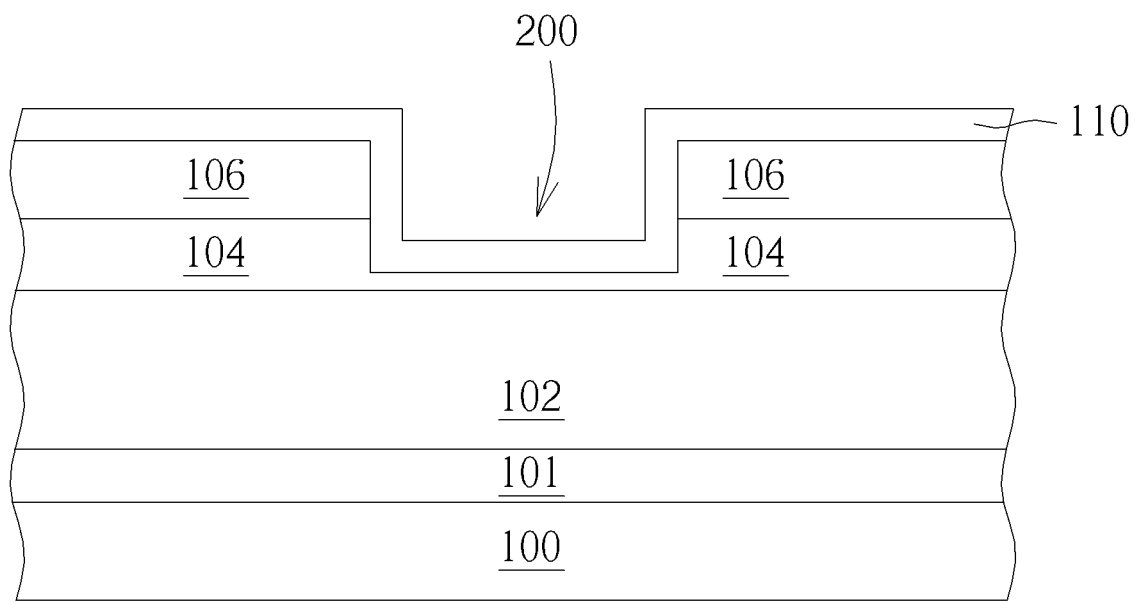

As shown in FIG. 4, subsequently, a surface modification layer 110 is conformally deposited on an interior surface of the gate recess 200 and on the top surface of the dielectric passivation layer 106. According to an embodiment, for example, the surface modification layer 110 is an amorphous silicon layer. Preferably, the amorphous silicon layer 110 may have a thickness of equal to or less than 10 angstroms. According to an embodiment, the dielectric passivation layer 106 is thicker than the surface modification layer 110.

Figure 5:
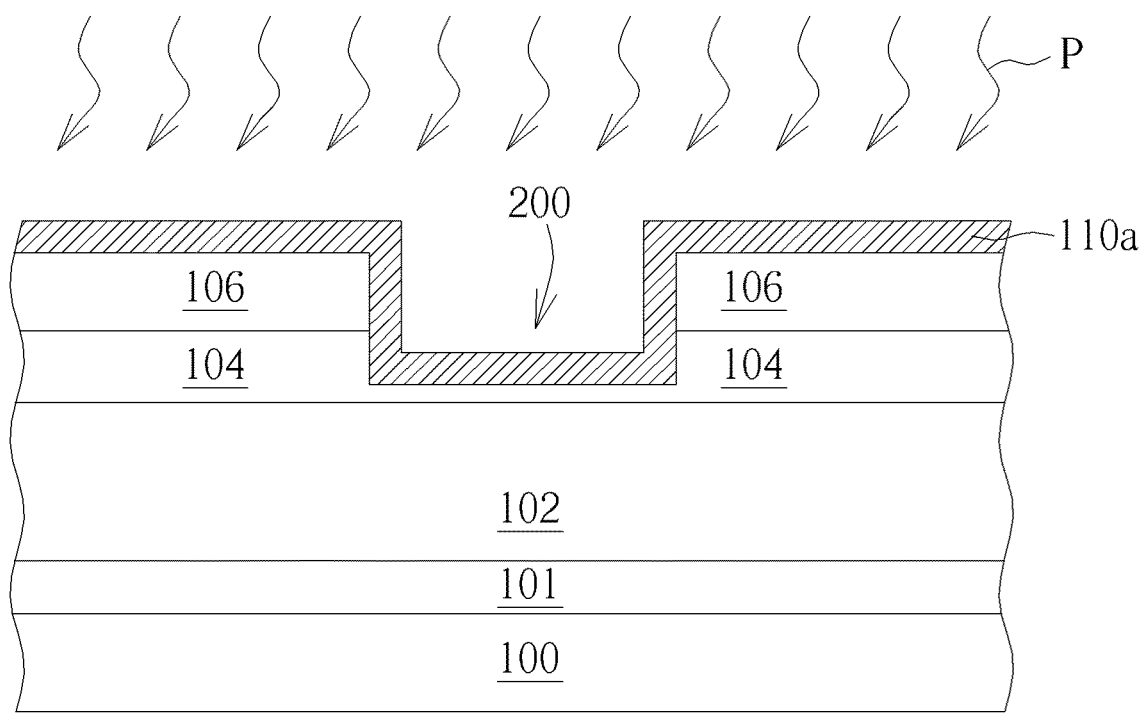

As shown in FIG. 5, the surface modification layer 110 is then subjected to a treatment P such as an oxidation treatment, thereby transforming an entire thickness of the amorphous silicon layer is into a treated surface modification layer 110a such as a silicon oxide layer. In some embodiments, the treatment P may be a nitridation treatment and the entire thickness of the amorphous silicon layer 110 is transformed into a silicon nitride layer. In some embodiments, the surface modification layer 110 may be subjected to the nitride treatment and is then subjected to the oxidation treatment. In some embodiments, the surface modification layer 110 may be subjected to the nitride treatment and is then subjected to the oxidation treatment. According to some embodiments, the treatment P may comprise anneal processes, plasma treatment, ion implantation or wet clean, but is not limited thereto.

It is advantageous to use the present invention because the surface modification layer 110 after subjected to the treatment P can reduce the surface roughness on the interior surface of the gate recess 200 and the interface defects can be significantly decreased. The surface modification layer 110 also prevents the GaN/AlGaN from oxidation.

Figure 6:
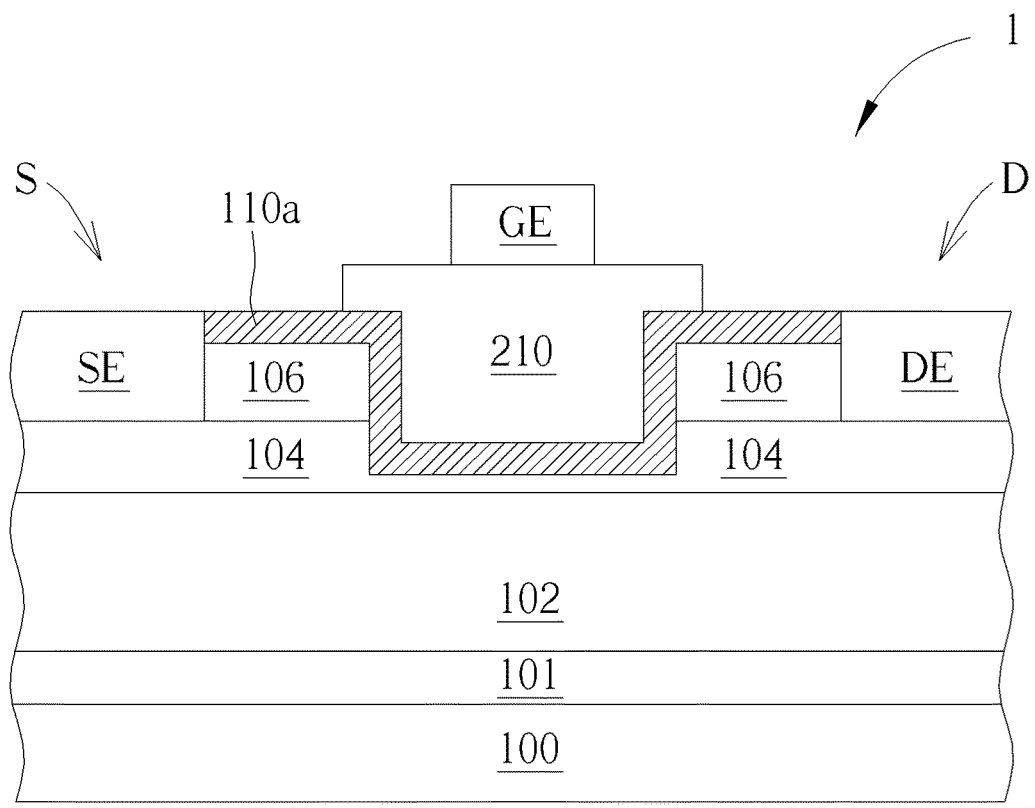

As shown in FIG. 6, after the treatment P is completed, a P-type GaN layer 210 is formed in the gate recess 200 and on the treated surface modification layer 110a. After the formation of the P-type GaN layer 210 in the gate recess 200, a gate electrode GE is formed on the P-type GaN layer 210. Thereafter, a source electrode SE may be formed in a source region S and a drain electrode DE may be formed in a drain region D, thereby forming the high electron mobility transistor 1. According to an embodiment, for example, the gate electrode GE, the source electrode SE, and the drain electrode DE may comprise a metal, but is not limited thereto.

Structurally, as shown in FIG. 6, the high electron mobility transistor 1 includes a substrate 100, a channel layer 102 on the substrate 100, an electron supply layer 104 on the channel layer 102, a dielectric passivation layer 106 on the electron supply layer 104, a gate recess 200 in the dielectric passivation layer 106 and the electron supply layer 104, a surface modification layer 110a on an interior surface of the gate recess 200, and a P-type GaN layer 210 in the gate recess 200 and on the surface modification layer 110a. According to an embodiment, after subjecting to the treatment P such as oxidation or nitridation, the surface modification layer 110a may have a gradient silicon concentration. That is, the silicon concentration of the surface modification layer 110a is not a constant across the entire thickness of the surface modification layer 110a.

According to an embodiment, the surface modification layer 110a is a silicon oxide layer or a silicon nitride layer. According to an embodiment, the gate recess 200 does not penetrate through the electron supply layer 104. According to an embodiment, the high electron mobility transistor 1 further comprises a gate electrode GE on the P-type GaN layer 210, a source electrode SE in a source region S and a drain electrode DE in a drain region D.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a high electron mobility transistor, comprising:
   providing a substrate;
   forming a channel layer on the substrate;
   forming an electron supply layer on the channel layer;
   forming a dielectric passivation layer on the electron supply layer;
   forming a gate recess into the dielectric passivation layer and the electron supply layer;
   conformally depositing a surface modification layer on an interior surface of the gate recess;
   subjecting the surface modification layer to an oxidation treatment or a nitridation treatment, wherein the surface modification layer is first subjected to the oxidation treatment and is then subjected to the nitridation treatment; and
   forming a P-type GaN layer in the gate recess and on the surface modification layer.

2. The method according to claim 1, wherein the surface modification layer is an amorphous silicon layer.

3. The method according to claim 2, wherein the amorphous silicon layer has a thickness of equal to or less than 10 angstroms.

4. The method according to claim 1, wherein the gate recess does not penetrate through the electron supply layer.

5. The method according to claim 1, wherein the dielectric passivation layer comprises oxide or aluminum nitride.

6. The method according to claim 1, wherein the dielectric passivation layer is thicker than the surface modification layer.

7. The method according to claim 1, wherein the dielectric passivation layer has a thickness of about 20 nanometers.

8. The method according to claim 1, wherein before forming the channel layer on the substrate, the method further comprises:
    forming a buffer layer on the substrate.

9. The method according to claim 8, wherein the buffer layer comprises AlN or AlGaN.

10. The method according to claim 1, wherein the substrate is a silicon substrate.

11. The method according to claim 1, wherein the channel layer comprises intrinsic GaN.

12. The method according to claim 11, wherein the electron supply layer comprises AlGaN.

13. The method according to claim 1, wherein after forming the P-type GaN layer in the gate recess, the method further comprises:
    forming a gate electrode on the P-type GaN layer; and
    forming a source electrode in a source region and a drain electrode in a drain region.

\* \* \* \* \*